United States Patent
Nakagawa et al.

(10) Patent No.: US 6,384,313 B2
(45) Date of Patent: May 7, 2002

(54) SOLAR CELL MODULE AND METHOD OF PRODUCING THE SAME

(75) Inventors: Katsumi Nakagawa, Atsugi; Shoji Nishida, Hiratsuka; Yukiko Iwasaki, Atsugi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/790,589

(22) Filed: Feb. 23, 2001

Related U.S. Application Data

(62) Division of application No. 09/310,953, filed on May 13, 1999, now Pat. No. 6,248,948.

(30) Foreign Application Priority Data

May 15, 1998 (JP) ............................................ 10-133914

(51) Int. Cl.[7] .............................................. H01L 25/00
(52) U.S. Cl. ........................ 136/244; 257/446; 257/466
(58) Field of Search .................................. 136/244, 249, 136/256; 257/446, 466, 452; 438/28, 39, 42, 66, 67, 73, 34

(56) References Cited

U.S. PATENT DOCUMENTS

| | | | |
|---|---|---|---|
| 3,713,893 A | 1/1973 | Shirland | 136/89 |
| 3,833,425 A | 9/1974 | Leinkram et al. | 136/89 |
| 3,912,539 A | 10/1975 | Magee | 136/89 |
| 3,956,765 A | 5/1976 | Fischer et al. | 357/30 |
| 4,638,109 A | 1/1987 | Ishihara et al. | 136/244 |
| 5,017,243 A | 5/1991 | Otsubo | 136/244 |
| 5,232,518 A | 8/1993 | Nath et al. | 136/251 |
| 5,437,734 A | 8/1995 | Matsushita et al. | 136/249 |
| 5,593,901 A | 1/1997 | Oswald et al. | 437/2 |
| 6,248,948 B1 * | 6/2001 | Nakagawa et al. | 136/244 |

FOREIGN PATENT DOCUMENTS

| | | |
|---|---|---|
| JP | 3-24768 | 2/1991 |
| JP | 5-283722 | 10/1993 |
| JP | 7-302889 | 11/1995 |

OTHER PUBLICATIONS

M.A. Green, et al., "High–Efficiency Silicon Solar Cells", IEEE Transactions on Electron Devices, vol. ED–31, No. 5, pp. 682–683 (1984).

H. S. Rauschenbach, Solar Cell Array Design Handbook, Van Nostrand Reinhold Co., p. 161 (1980).

* cited by examiner

Primary Examiner—Rena L. Dye
Assistant Examiner—Michael C. Miggins
(74) Attorney, Agent, or Firm—Fitzpatrick, Cella, Harper & Scinto

(57) ABSTRACT

A solar cell module comprises a plurality of unit cells connected in series, each of the unit cells comprising in this order an electrode, a first semiconductor layer having a first conductivity type and a second semiconductor layer having a second conductivity type. The electrode has a region not covered with the first semiconductor layer. The second semiconductor layer has a main region and a subregion which are separated by a groove. The main region of the second semiconductor layer in one unit cell is electrically connected to the region of the electrode not covered with the first semiconductor layer in another unit cell adjacent to the one unit cell. The region of the electrode not covered with the first semiconductor layer in the one unit cell is electrically connected to the subregion of the second semiconductor layer in the another unit cell. With this structure it is possible to simplify the formation of a bypass diode invention therefore provide solar cell module with high reliability at a low cost.

17 Claims, 10 Drawing Sheets

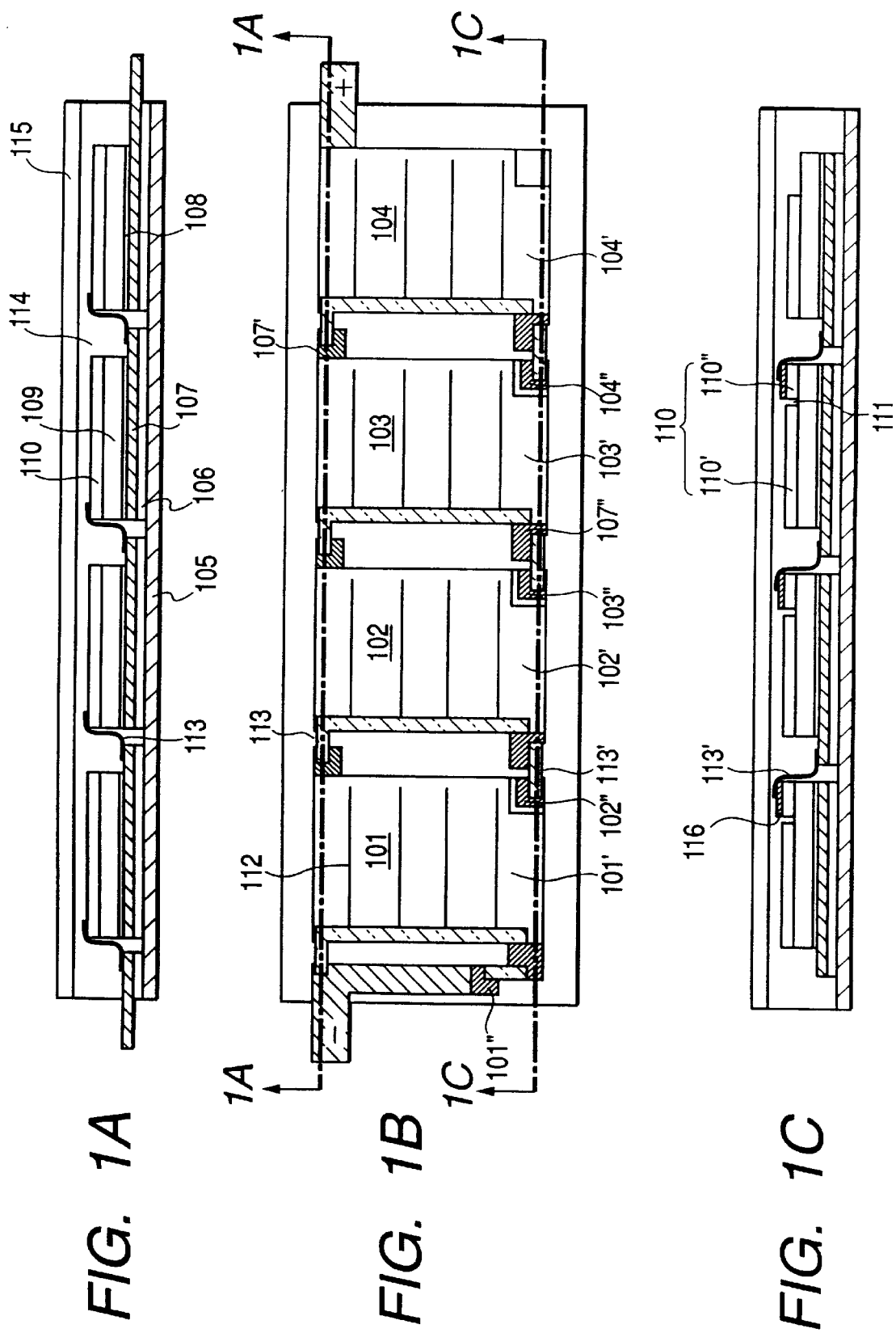

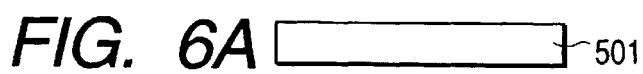
FIG. 6A
FIG. 6B
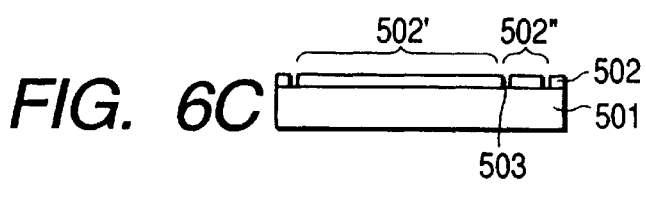
FIG. 6C
FIG. 6C'
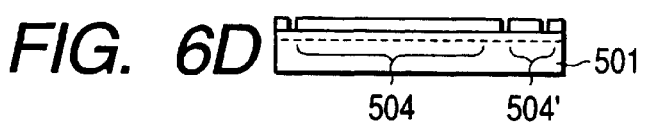
FIG. 6D
FIG. 6E'
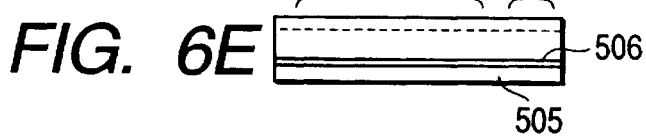
FIG. 6E
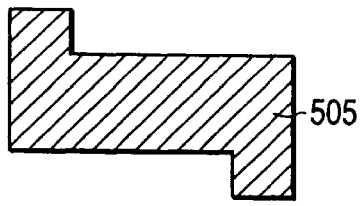
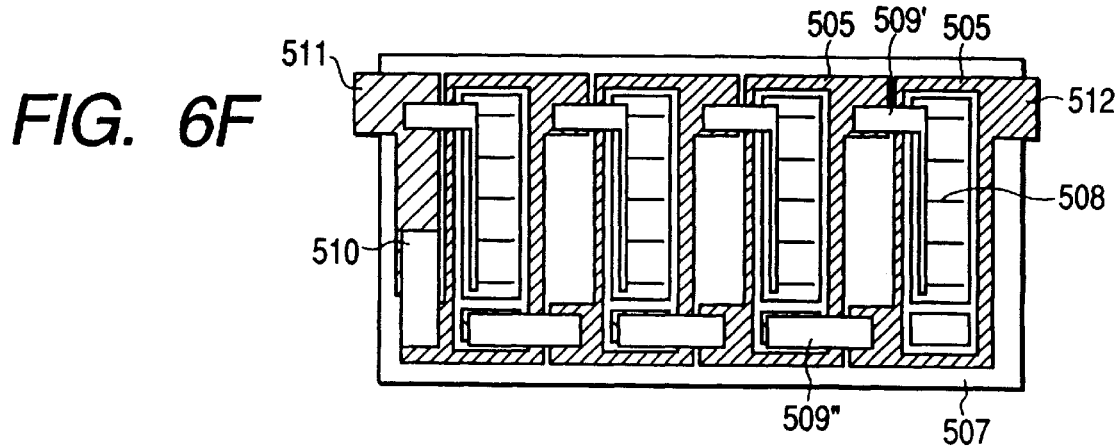
FIG. 6F

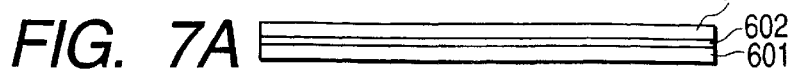
FIG. 7A
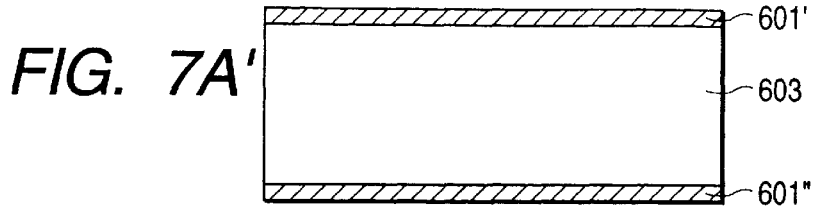
FIG. 7A'
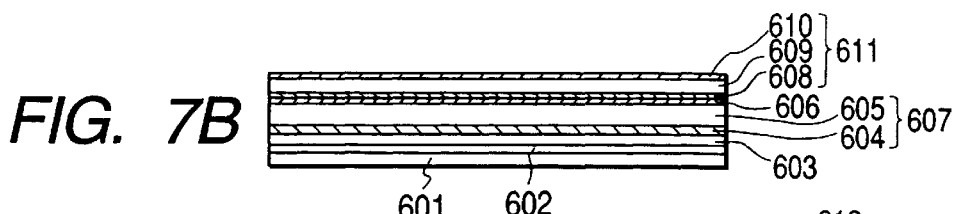
FIG. 7B
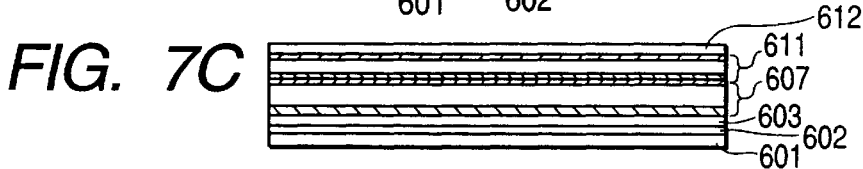
FIG. 7C
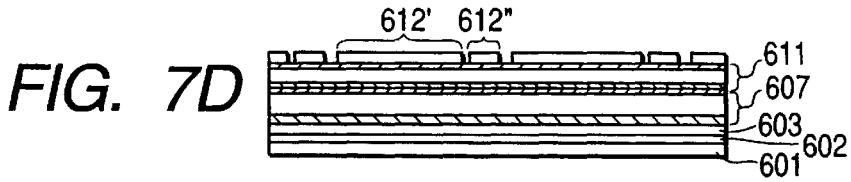
FIG. 7D
FIG. 7D'
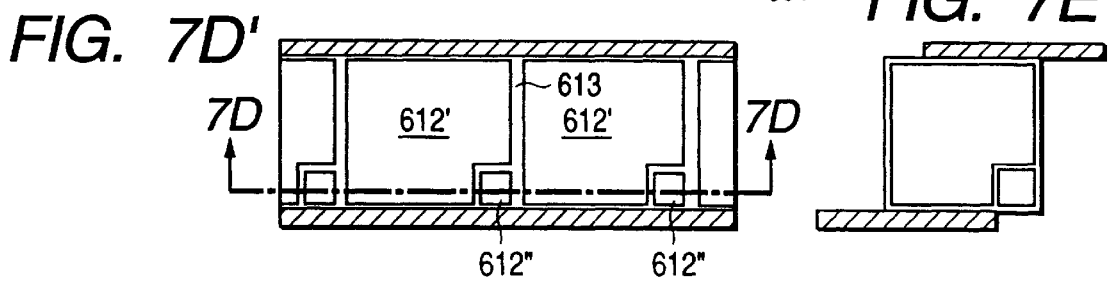
FIG. 7E
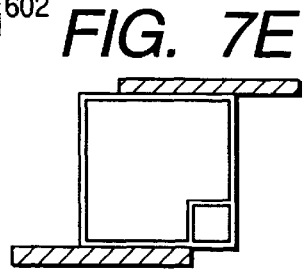
FIG. 7F
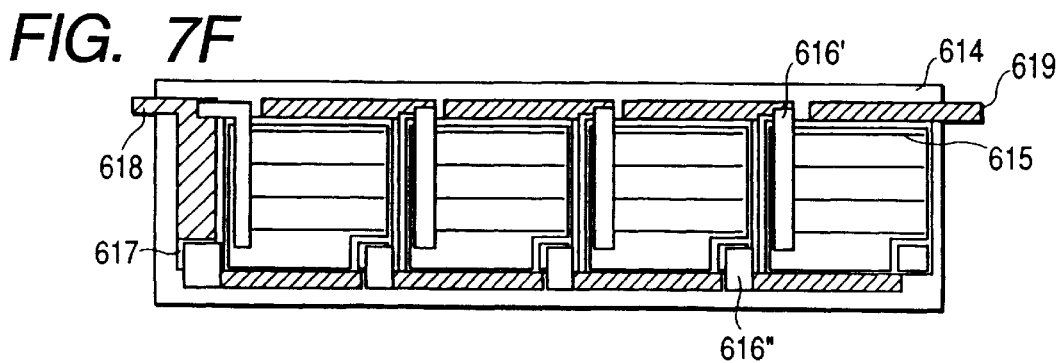

SOLAR CELL MODULE AND METHOD OF PRODUCING THE SAME

This application is a divisional of U.S. patent application Ser. No. 09/310,953 filed May 13, 1999, now U.S. Pat. No. 6,248,948.

BACKGROUND OF THE INVENTION

1. Field of the Invention.

The present invention relates to a solar cell module and a method of producing it. More specifically, the invention relates to a solar cell module which can be produced at a low cost, which shows a smaller energy conversion efficiency degradation even when the module is partly shaded solar cell module and which is not damaged even when maintained in such state for a long time, and a method of producing such solar cell module. The present invention also relates to a solar cell module that can effectively exhibit a high energy conversion efficiency when installed on a curved surface, and a method of producing such solar cell module.

2. Related Background Art

Solar cells have been widely developed and are starting to be introduced for use in the home, as the environmentally acceptable clean power source. Ordinary electric appliances are usually driven with an alternating current of 100 V. On the other hand, the output of a solar cell is a direct current and an inverter has to be used in order to obtain an alternating current. In such a case the inverter cannot operate efficiently unless the output of the solar cell is at least 100 V. Also when the electric power is stored in a secondary battery, the DC output can be directly used, but the secondary battery is usually used at 12 V to 24 V.

However, a unit cell of a solar cell can only provide an output voltage of 0.5 to 0.6 V, also a unit cell of an amorphous silicon solar cell of a relatively high output voltage can only provide an output voltage of 0.7 to 0.9 V alone, and the tandem cell of plural junctions stacked can only provide an output voltage of about 2 V at maximum. For this reason, the solar cell is usually used as a module in which plural unit cells are connected in series. Such formation of the module by series connection of the unit cells of the solar cell also provides an advantage of reducing the current in the module, thereby remarkably lowering the power loss resulting from electric resistance in the wiring part.

However, during the use of the module with the unit cells connected in series, there may generate a situation where the shade of a wood or a building falls on a certain unit cell of the unit cells constituting the module, whereby only the output of the certain unit cell extremely drops. Such a situation is called a "partial shade state". In such a partial shade state, the output voltage of the entire module dramatically drops, and in some cases the shaded unit cell merely functions as a load to cause heat generation or is damaged by a strong reverse bias voltage. In this regard, it is known to connect a small diode which is called a bypass diode to a solar cell element (unit cell) in parallel and in an opposite direction thereto, thereby reducing the influence of such a partially shaded state.

FIG. 4 shows the working principle of such a bypass diode, wherein unit solar cells 301 to 304 of the solar cell are connected in series and further connected to an external load 305. In a normal state under irradiation with sunlight 306, there is generated an output voltage equal to the sum of the output voltages of the unit cells 301 to 304 (in FIG. 4, reference character A indicates a terminal at a negative side and B indicates, a terminal at a positive side). However, when the shade of an object 307 falls, for example, on the unit cell 303, the unit cell 303 substantially functions as a load of an extremely high resistance, whereby the output current of the module is reduced and the output voltage is extremely lowered. In addition the unit cell 303 receives, in the opposite direction, the sum of the output voltages of the unit cells 301, 302 and 304, whereby such reverse bias voltage causes abnormal heat generation in the unit cell 303 or damages the unit cell 303 by the reverse electric field.

On the other hand, in the case of providing a bypass diode 303' with the unit cell 303, the unit cell 303 is short circuited, whereby an originally intended current substantially flows in the entire circuit and the unit cell 303 can be protected from the reverse electric field. When the unit cell 303 functions in the normal state, the bypass diode 303' is reversely biased, whereby little leak current flows and the function of the module is not affected. The bypass diodes 301' to 304' are provided for the unit cells 301 to 304 of the solar cell, respectively, thereby causing damage by the reverse electric field is in a unit cells unit.

However, such bypass diodes are required in the same number as that of the unit cells and therefore the cost and complexity the wiring step for this purpose is appreciable. For example, the Japanese Patent Application Laid-Open No. 3-24768 proposes that the bypass diode is integrally formed with the unit cell. In the prior art, as shown in FIGS. 9, 10, 11A and 11B, n-type diffusion regions are formed on both sides of a p-type with substrate and one of such diffusion regions is utilized as the bypass diode. In these drawings, reference character 20 indicates a p-type silicon substrate; 21 and 22, n-type diffusion layers; 23 and 24, electrodes; SC, a unit cell; BD, a bypass diode; 1, 2 and 3, unit cells; A and B, bypass diodes; C, a bypass diode; and 25, 26, 27 and 28, lead wires. Such a configuration, however, has drawbacks such as requiring a complex series connection step and also requiring one external diode per module. For this reason, the above-mentioned patent application also proposes a method of integrally forming an independent bypass diode in the substrate, as shown in FIGS. 12A, 12B, 13A and 13B. In these drawings, reference characters 61 and 101 indicate p-type silicon substrates; 62 and 102, n$^+$-type diffusion layers; 63 and 103, n-type diffusion regions; 64 and 104, p-type diffusion layers; 65 and 105, oxide films; 66 and 106, oxidation preventing films; 67 and 107, surface electrodes; 68 and 108, back surface electrodes; and 109, a junction short circuit portion. This configuration certainly simplifies the series connection step, but requires an additional semiconductor step for incorporating the diode into the substrate, so that this configuration cannot reduce the total manufacturing cost of the solar cell module.

SUMMARY OF THE INVENTION

In consideration of the foregoing, the object of the present invention is to provide a solar cell module of a novel configuration which is capable of minimizing the reduction of the module output without damage in the unit cells even in the partial shade state and which is not complex in the semiconductor step or in the series step, as compared to solar cell module. The case without such countermeasure, and a method of producing such a solar cell module.

According to the view of the present inventors, the structure shown in FIG. 9 is rather advantageous in the prior art term of simplifying the semiconductor step. Namely, the n-type diffusion layers (one being used for the light-receiving region, the other being used for the bypass diode)

on both sides of the p-type substrate can be prepared in one step. However, the n-type diffusion layer for the bypass diode has to be thereafter removed except for a necessary area. Also as pointed out in the above-mentioned patent application, it is not easy to form the series connection bridging the top side and the bottom side of the substrates as shown in FIGS. 11A and 11B.

The present inventors have conceived to form the light-receiving portion of the solar cell element and the bypass diode on the same side of the substrate. Such a configuration allows for series connection from only one side of the substrate. The unit cell of such structure, if prepared by a simple method, will provide a countermeasure against the partial shade state at the lowest cost in total.

The present invention provides a solar cell module comprising a plurality of unit cells connected in series, each of the unit cells comprising in this order an electrode, a first semiconductor layer having a first conductivity type and a second semiconductor layer having a second conductivity type, wherein the electrode has a region not covered with the first semiconductor layer, wherein the second semiconductor layer has a main region and a subregion which are separated by a groove, wherein the main region of the second semiconductor layer in one unit cell of the unit cells is electrically connected to the region of the electrode not covered with the first semiconductor layer in another unit cell adjacent to the one unit cell, and wherein the region of the electrode not covered with the first semiconductor layer in the one unit cell is electrically connected to the subregion of the second semiconductor layer in the another unit cell.

In the present invention, the second semiconductor layer is preferably a layer having a low resistance.

Also, the second semiconductor layer is preferably a doped layer having a high dopant density.

Further, it is preferable that the first semiconductor layer is a p-type semiconductor layer and the second semiconductor layer is an $n^+$-type semiconductor layer, or that the first semiconductor layer is an n-type semiconductor layer and the second semiconductor layer is a $p^+$-type semiconductor layer.

Still further, it is preferable that each of the unit cells has a rectangular shape, a long side direction of the rectangular shape is arranged so as to be perpendicular to a generating line of a curved surface represented by a cylindrical surface or a conical surface, and each of the unit cells is connected in series in a direction of the generating line.

Still further, it is preferable that at least one of the first semiconductor layer and the second semiconductor layer is a single-crystalline silicon layer.

The first semiconductor layer is preferably a semiconductor sheet. An electrode plate, a conductive sheet or the like is preferably used as the electrode.

The present invention also provides a solar cell module comprising a plurality of unit cells connected in series, each of the unit cells comprising in this order an electrode, a semiconductor layer and a transparent electrode layer, wherein the electrode has a region not covered with the semiconductor layer, wherein the transparent electrode layer has a main region and a subregion which are separated by a groove, wherein the main region of the transparent electrode layer in one unit cell of the unit cells is electrically connected to the region of the electrode not covered with the semiconductor layer in another unit cell adjacent to the one unit cell, and wherein the region of the electrode not covered with the semiconductor layer in the one unit cell is electrically connected to the subregion of the transparent electrode layer in the another unit cell.

Hereinafter, the region of the electrode not covered with the (first) semiconductor layer is referred to as the "tab" in some cases.

The present invention also provides a method of producing a solar cell module, which comprises the steps of:

providing a plurality of unit cells, each of the unit cells being produced by forming a second semiconductor layer having a second conductivity type on one surface of a first semiconductor layer having a first conductivity type, forming a groove in the second semiconductor layer to separate the second semiconductor layer into a main region and a subregion, and forming an electrode having a region not covered with the first semiconductor layer on the other surface of the first semiconductor layer;

adjacently arranging the plurality of unit cells;

electrically connecting the main region of the second semiconductor layer in one unit cell of the unit cells to the region of the electrode not covered with the first semiconductor layer in another unit cell adjacent to the one unit cell;

electrically connecting the region of the electrode not covered with the first semiconductor layer in the one unit cell to the subregion of the second semiconductor layer in the another unit cell.

The present invention also provides a method of producing a solar cell module, which comprises the steps of:

providing a plurality of unit cells, each of the unit cells being produced by forming a transparent electrode layer on one surface of a semiconductor layer, forming a groove in the transparent electrode layer to separate the transparent electrode layer into a main region and a subregion, and forming an electrode having a region not covered with the semiconductor layer on the other surface of the semiconductor layer;

adjacently arranging the plurality of unit cells;

electrically connecting the main region of the transparent electrode layer in one unit cell of the unit cells to the region of the electrode not covered with the semiconductor layer in another unit cell adjacent to the one unit cell;

electrically connecting the region of the electrode not covered with the semiconductor layer in the one unit cell to the subregion of the transparent electrode layer in the another unit cell.

The present invention also provides a method of producing a solar cell module, which comprises the steps of:

providing a plurality of unit cells, each of the unit cells being produced by forming a dopant supplying layer on one surface of a first semiconductor layer having a first conductivity type, forming a groove in the dopant supplying layer to separate the dopant supplying layer into a main region and a subregion, forming a second semiconductor layer having a second conductivity type in the one surface of the first semiconductor layer by diffusing a dopant from the dopant supplying layer, and forming an electrode having a region not covered with the first semiconductor layer on the other surface of the first semiconductor layer;

adjacently arranging the plurality of unit cells;

electrically connecting the main region of the second semiconductor layer in one unit cell of the unit cells to the region of the electrode not covered with the first semiconductor layer in another unit cell adjacent to the one unit cell;

electrically connecting the region of the electrode not covered with the first semiconductor layer in the one unit cell to the subregion of the second semiconductor layer in the another unit cell.

The present invention also provides a method of producing a solar cell module, which comprises the steps of: providing a plurality of unit cells, each of the unit cells being produced by forming a first semiconductor layer having a first conductivity type on an electrode, forming a second semiconductor layer having a second conductivity type on the first semiconductor layer, and forming a groove in the second semiconductor layer to separate the second semiconductor layer into a main region and a subregion, a portion of a surface of the electrode being exposed;

adjacently arranging the plurality of unit cells;

electrically connecting the main region of the second semiconductor layer in one unit cell of the unit cells to the region of the electrode not covered with the first semiconductor layer in another unit cell adjacent to the one unit cell;

electrically connecting the region of the electrode not covered with the first semiconductor layer in the one unit cell to the subregion of the second semiconductor layer in the another unit cell.

In the above method, it is preferable that the first semiconductor layer is formed so that the portion of the surface of the electrode is exposed, or that after the first semiconductor layer is formed, the portion of the surface of the electrode is exposed.

Further, the present invention provides a method of producing a solar cell module, which comprises the steps of:

providing a plurality of unit cells, each of the unit cells being produced by forming a semiconductor layer on an electrode, forming a transparent electrode layer on the semiconductor layer, and forming a groove in the transparent electrode layer to separate the transparent electrode layer into a main region and a subregion, a portion of a surface of the electrode being exposed;

adjacently arranging the plurality of unit cells;

electrically connecting the main region of the transparent electrode layer in one unit cell of the unit cells to the region of the electrode not covered with the semiconductor layer in another unit cell adjacent to the one unit cell;

electrically connecting the region of the electrode not covered with the semiconductor layer in the one unit cell to the subregion of the transparent electrode layer in the another unit cell.

In the above method, it is preferable that the first semiconductor layer is formed so that the portion of the surface of the electrode is exposed, or that after the first semiconductor layer is formed, the portion of the surface of the electrode is exposed.

Additionally, in the above methods of producing a solar cell module, the formation of the groove is preferably conducted by laser scribing.

BRIEF DESCRIPTION OF THE DRAWINGS

FIG. 1B is a top plan view showing a solar cell module according to the example of the present invention, and FIGS. 1A and 1C are cross-sectional views taken along the line 1A—1A and the line 1C—1C of FIG. 1B, respectively;

FIGS. 6A, 6B, 6C, 6D and 6E are cross-sectional and FIG. 6F is a top plan view, respectively, for showing production steps for a solar cell module according to the example of the present invention, FIG. 6C' is a top plan view of FIG. 6C, and FIG. 6E' is a bottom plan view of FIG. 6E;

FIGS. 7A, 7B, 7C and 7D are cross-sectional views and FIGS. 7A', 7D', 7E and 7F are top plan views, respectively, for showing production steps for a solar cell module according to the example of the present invention, FIG. 7A' is a top plan view of FIG. 7A, and FIG. 7D' is a top plan view of FIG. 7D which is a cross-sectional view taken along line 7D—7D of FIG. 7D';

DETAILED DESCRIPTION OF THE PREFERRED EMBODIMENTS

Figure 2A:
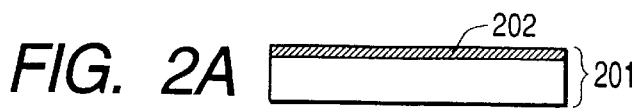
FIGS. 2A, 2B, 2C, 2D, 2E and 2F are cross-sectional views showing production steps for a solar cell module according to the example of the present invention, FIG. 2D being a cross-sectional view taken along the line 2D—2D of FIG. 2D' which is a top plan view of FIG. 2D, and FIG. 2F' is a bottom plan view of FIG. 2F.

The present invention will be described in detail by embodiments thereof, while making reference to the attached drawings. FIGS. 1A to 1C show one constitutional example of the solar cell module of the present invention. In this embodiment, a crystalline semiconductor is used, but the present invention is applicable to semiconductors of various forms.

FIG. 1B is a top plan view; FIG. 1A is a cross-sectional view taken along line 1A—1A in FIG. 1B, showing the connection of a light-receiving portion; and FIG. 1C is a cross-sectional view taken along line 1C—1C in FIG. 1B, showing the connection of bypass diodes. On a supporting substrate 105, back electrode plates 107 are adhered in predetermined positions with adhesive layers 106. The supporting substrate 105 desirably has insulating properties, but it can also be electrically conductive provided that it is provided with an insulating surface coating or that the adhesive layer 106 has insulating properties. Also, when a semiconductor substrate 109 is thin or small, the flexibility of the module can be increased by employing a thin supporting substrate.

The back electrode plate 107 can be shaped substantially according to the semiconductor substrate 109 which is a (first) semiconductor layer, but is provided, at least in a part thereof, with portions (tabs) 107' and 107" that are not covered with the semiconductor substrate 109. The semiconductor substrate 109 is adhered to the back electrode plate 107 by a conductive adhesive layer 108, but the (first)

semiconductor layer may be formed by depositing a semiconductor on the back electrode plate 107 in place of using the semiconductor substrate. In such a case, the tab is preferably formed by masking a part of the back electrode plate 107 so as to avoid deposition of the semiconductor, or by peeling a part of the deposited semiconductor layer so as to expose the back electrode plate 107.

In this embodiment, the semiconductor substrate 109 is doped so as to have an adequate n- or p-type conductivity. A doped layer 110 with a high density and having a low resistance and a conductivity type ($p^+$-or $n^+$-type) opposite to that of the semiconductor substrate 109 is formed on the surface of the semiconductor substrate 109. The highly doped layer 110 having the opposite conductivity type may be grown on the semiconductor substrate 109 or may be formed in the substrate 109 by forming a dopant supplying layer and then applying a heat treatment to diffuse the dopant. The layer 110 of the opposite conductivity is divided by a groove 111 into a region with larger areas 110' (main region) and a region with smaller areas 110" (subregion). Thus the unit cells 101 to 104 are separated into light receiving regions 101' to 104' and bypass diodes 101" to 103" (unit cell 104 is not provided with the bypass diode as explained later). The groove is preferably formed with laser scribing, for example, suitably utilizing a YAG laser (preferably the second harmonic wave easily absorbable by the semiconductor) or an excimer laser.

The layer 110 of the opposite conductivity type which is doped in a high density shows a considerably low sheet resistance, but there is a problem of the loss generated from such resistance when the areas of the layer 110 increase. For this reason, a current collecting electrode 112 is often provided. In the following description, the current collecting electrode 112 will be explained as being composed of a low-resistance copper wire, but the present invention is likewise applicable to a case where the current collecting electrode 112 is composed of a metal film formed, for example, by conductive paste printing, plating, masked evaporation or masked sputtering. The unit cells 101 to 104 of the above-described configuration are adjacently arranged. The current generated, for example, in the light-receiving portion 103' is collected by the current collecting electrode 112 and is supplied by a busbar 113 for the light-receiving portion to the tab of the back electrode plate 107' of the adjacent unit cell 102. The series connection is successively made in this manner.

Figure 4:
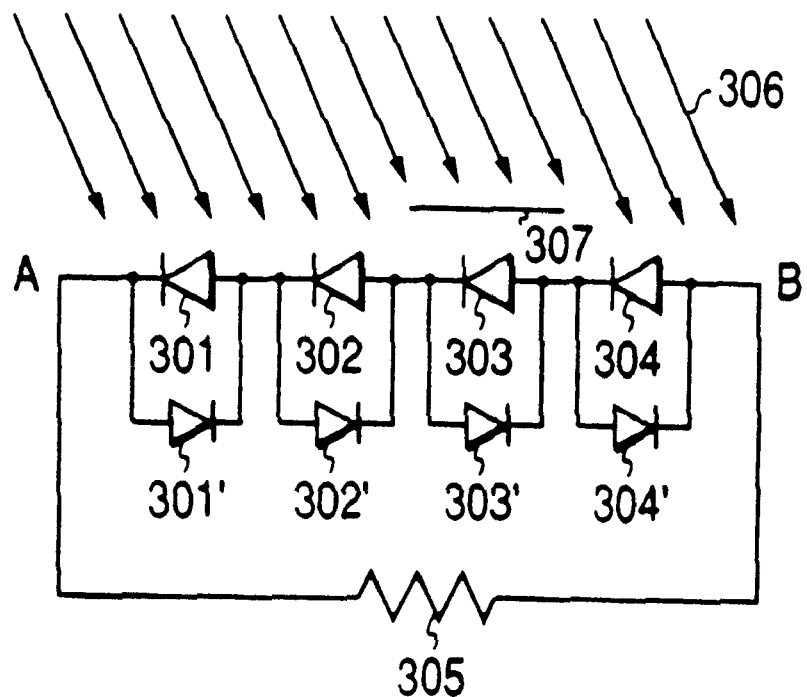
FIG. 4 is an equivalent circuit diagram of a solar cell module for illustrating the reduction of the effect of the partial shade state.
Figure 5:
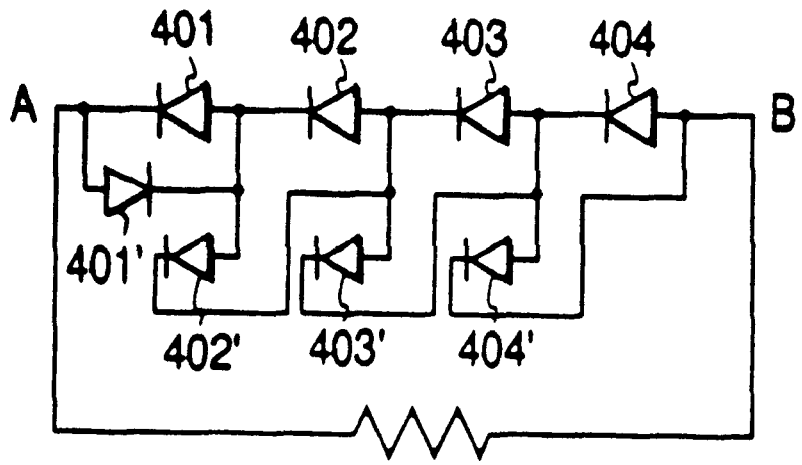
FIG. 5 is an equivalent circuit diagram of a solar cell module according to the example of the present invention.

On the other hand, the current flowing in the bypass diode portion 103" is supplied by a busbar 113' for the bypass diode portion to the tab of the back electrode plate 107 of the unit cell 103. The series connection is successively made in this manner but in a direction opposite to that of the light-receiving portion. The bypass diode should generally be shielded by a mask 116 from the light as shown in FIG. 1C, but the busbar 113' may serve as the mask. The bypass diode is unnecessary in the unit cell 104 at the right hand end. In the unit cell 101 at the left hand end, the bypass diode 101" is connected by an external line because no unit cell is present at the left side. The equivalent circuit of the above-described configuration is shown in FIG. 5 and is equivalent to that in FIG. 4. The surface of each unit cell is protected by a filler layer 114 and a surface protecting layer 115.

Since a semiconductor generally has a high refractive index and therefore the semiconductor shows a large loss of incident light by surface reflection, there is often provided an anti-reflection layer formed by deposition, with a thickness of about 0.05 to about 0.08 $\mu$m, a transparent dielectric material such as titanium dioxide or zinc sulfide or a transparent conductive material such as tin oxide, zinc oxide or ITO, having a refractive index approximately equal to the geometrical average of refractive indexes of the air and the semiconductor layer, though such an antireflection layer is not shown in FIGS. 1A to 1C. When a transparent conductive material is employed, the antireflection layer also functions as the transparent electrode layer and a groove may be formed therein to form the light-receiving portion and the bypass diode portion.

The solar cell module of the above-described configuration has the following features.

(1) In contrast to a case employing a diode chip, the bypass diode portion has the same thickness as that of the light-receiving portion, so that the completed module is compact, has no protruded portion and is not easily broken by external force.

(2) Since the bypass diode is provided at the same side of the light-receiving portion, the steps of adhesion of the unit cell to the supporting substrate, adhesion of the current collecting electrode and series connection and the like can be successively executed by stacking in order from the bottom to the top and can therefore be easily automated.

(3) The production steps can be simplified since the bypass diode and the light-receiving portions utilize a semiconductor junction formed in the same step and are mutually separated afterwards.

(4) The separation of the bypass diode can be conducted extremely efficiently because it can be achieved by merely forming a groove, by laser scribing or etching, in an opposite conductive type layer (second semiconductor layer) (usually about 0.2 to about 0.5 $\mu$m) or a transparent conductive material (transparent electrode layer) (usually about 0.05 to about 0.08 $\mu$m) which is far thinner than a semiconductor substrate itself.

With the recent spread of the application of solar cells, there is an increasing interest for flexible solar cells utilizing amorphous silicon (a-Si), thin film crystals or the like. Because of the above-mentioned features, the present invention is particularly effective when applied to such flexible solar cell modules.

Also, even when the module is formed with a relatively thick semiconductor, the entire module can be made flexible by reducing the size of each unit cell to ensure flexibility at connection portions between the unit cells. However, the use of such smaller unit cells increases the possibility of causing the partial shade state and also the reverse bias voltage applied to the shaded cell, thereby easily damaging the unit cells. Also the countermeasure against such a situation becomes limitative in cost because a larger number of bypass diodes is required. Because of the above-mentioned features, the present invention is applicable even in such a situation without difficulty, as explained in more detail in the following examples.

In the following there will be given detailed explanation on the examples of the present invention, but the scope of the present invention is as explained in the foregoing and is not limited by these examples. Also in the attached drawings, the tabs, bypass diodes, busbars and the like are shown in an enlarged size for the purpose of clarity, but these components can, in fact, function satisfactorily in a size far smaller than the shown size, and the decrease of the output of the solar cell module per opening area of the solar cell module is practically negligible.

EXAMPLE 1

In the present example, the present invention was applied to a solar cell module employing a thin single-crystalline silicon sheet obtained by peeling an epitaxial film grown on a single-crystalline wafer by liquid phase growth from the wafer. The steps of producing such a solar cell module will be explained with reference to FIGS. 2A to 2F' and 3G to 3I. The details of the liquid phase growth step are described in Japanese Patent Application Laid-Open 5-283722, while the details of the peeling step of the epitaxial film are described in Japanese Patent Application Laid-Open Nos. 5-283722 and 7-302889.

In the following, there will be explained with reference to FIGS. 2A to 2F', the details of the method of producing the solar cell. At first a p$^+$-type single-crystalline silicon wafer 201 with a thickness of 500 µm was immersed in hydrofluoric acid solution diluted with ethanol. A positive voltage was applied to conduct anodization while a current was maintained under the conditions shown in Table 1 to obtain, on the surface of the wafer, a porous silicon layer 202 containing a plurality of micropores of several hundred Angstroms in diameter (FIG. 2A). The current was changed after 2.5 minutes.

TABLE 1

| Anodizing solution | HF:H$_2$O:C$_2$H$_5$OH = 1:1:1 |
|---|---|
| Current density | 5 mA/cm$^2$ → 30 mA/cm$^2$ |
| Anodizing time | 2.5 min → 30 sec |

Figure 2B:

Then the liquid phase epitaxial growth of silicon by a gradual cooling method was conducted on the surface of the porous layer 202. Specifically, at first, indium metal (In) was melted at 900° C. in a carbon boat placed in a hydrogen stream. Under the agitation of the melted metal, a polycrystalline silicon wafer was dissolved in the melted metal until saturation, and the temperature of the melted mixture solution was gradually lowered to 894° C. as a solution for epitaxial growth. Then the temperature of the atmosphere was adjusted to set the temperature of the wafer 201 having the porous layer 202 to 1030° C. in a hydrogen stream. After annealing for 5 minutes, the temperature was lowered until it was equal to the temperature of the solution. In this step, the micropores of the porous layer 202 were filled to obtain a thin flat seal layer 202' (FIG. 2B).

Figure 2C:
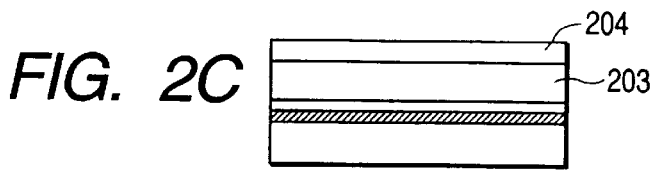

The seal layer 202' restores the single-crystallinity of the original wafer 201, so that epitaxial growth can be executed on such a seal layer. In this state the wafer 201 was immersed in the solution and was gradually cooled at a cooling rate of −1.0° C./min. to deposit a non-doped thin single-crystalline silicon layer 203 (first semiconductor layer) with a thickness of 20 µm, and the wafer was then lifted from the solution. Then, In was melted at 900° C. in a separate carbon boat, then it was saturated with Si, and Si containing 0.1 atomic % antimony (Sb) of Si was dissolved therein. The wafer subjected to the growth of the thin single-crystalline silicon layer 203 was immersed in the thus obtained solution to deposit an n$^+$-type single-crystalline silicon layer 204 (second semiconductor layer) with a thickness of 0.3 µm on the single-crystalline silicon layer 203, thereby forming a pn junction, and the wafer was lifted from the solution (FIG. 2C).

Figure 2D:
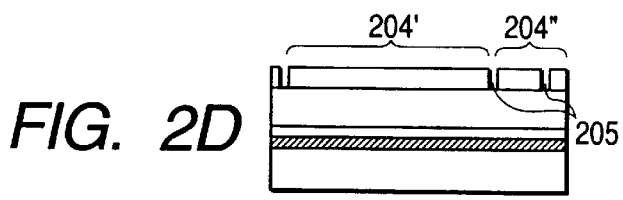
Figure 2D:
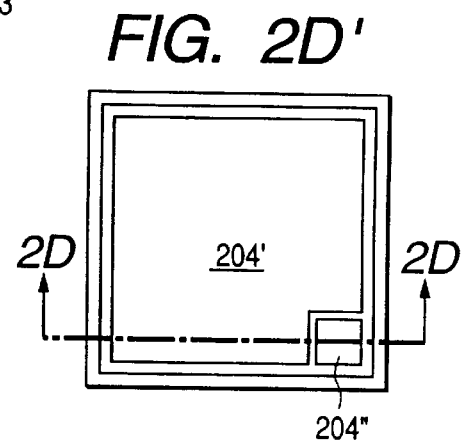

Then the surface was scanned with the beam of a YAG laser (second harmonic wave) to form a groove 205 on the n$^+$-type single-crystalline silicon layer 204 by laser scribing, thereby separating it into a light-receiving receiving portion 204' and a bypass diode portion 204". The depth of the groove 205 was set to about 0.5 µm which was necessary and sufficient for separating the thin n$^+$-type single-crystalline silicon layer 204, so that the throughput of the laser scribing step could be improved. In this operation, a groove was formed also in the peripheral portion of the substrate, in order to suppress the influence of the leakage current resulting from the incomplete junction state in such a peripheral portion (FIG. 2D). FIG. 2D' is a top plan view showing the groove formed by laser scribing, and FIG. 2D is a cross-sectional view taken along the line 2D—2D in FIG. 2D'. FIG. 2D' shows the positional relationship between the light-receiving portion 204' and the bypass diode portion 204" at the right hand corner.

Figure 2E:
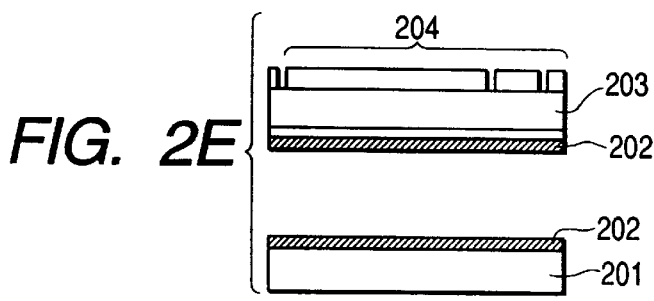
Figure 2F:
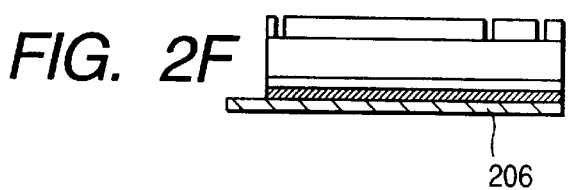
Figure 2F:
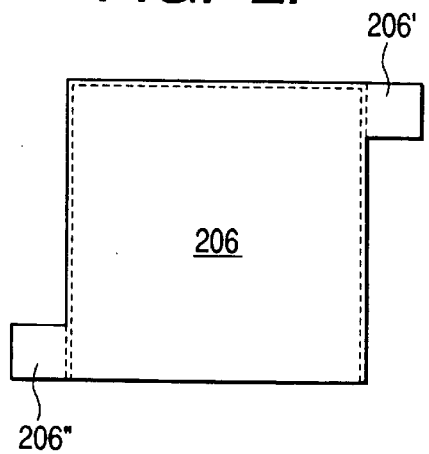

Then the surface of the wafer was vacuum chucked, and a peeling force was applied from the back surface of the wafer, thereby separating the liquid phase grown single-crystalline silicon sheet (202', 203, 204) from the wafer at the porous layer 202 (FIG. 2E). Subsequently, an aluminum sheet with a thickness of 50 µm having tabs for series connection of the light-receiving portion and for series connection of the bypass diode is adhered to the back surface of the thus peeled single-crystalline silicon sheet by heat fusion at 600° C. to obtain a back electrode plate 206 (FIG. 2F). FIG. 2F' is a bottom plan view showing the back electrode plate 206 corresponding to FIG. 2F. The shape of the back electrode plate 206 was substantially the same as that of the wafer 201 and the single-crystalline silicon sheet (202', 203, 204), but was provided with tabs 206' and 206" protruding from the single-crystalline silicon sheet (202', 203, 204) when they were superposed. Forty-eight unit cells were prepared in this manner. However, for the purpose of simplicity, the drawings show only 4 unit cells, and also the internal structure of the unit cell is not shown in the drawings.

Figure 3G:
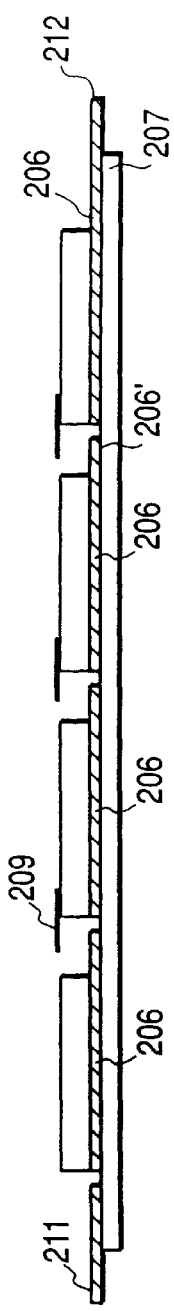
FIGS. 3G, 3H and 3I are cross-sectional views showing production steps for a solar cell module according to the example of the present invention, FIG. 3G being a cross-sectional view taken along the line 3G—3G of FIG. 3G' which is a top plan view of FIG. 3G.
Figure 3G:
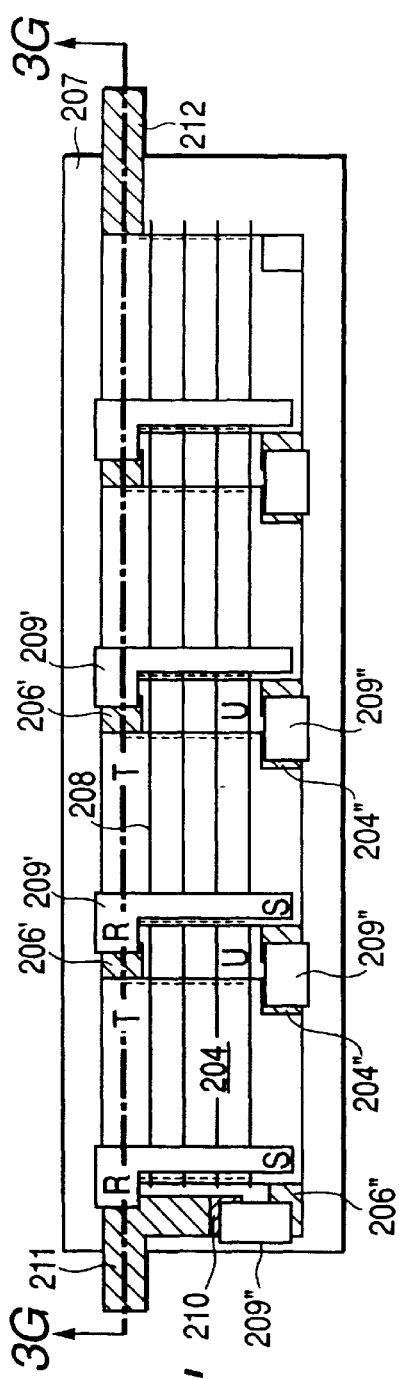

Next, the connection of the unit cells is described with reference to the cross-sectional view of FIG. 3G and the top plan view of FIG. 3G'. FIG. 3G is a cross-sectional view taken along the line 3G—3G of FIG. 3G'. The lower portion of the back electrode plate 206 was adhered to a PET sheet 207 of a thickness of 200 µm coated with an adhesive layer on a predetermined portion of the surface of the PET sheet as the supporting substrate. On both ends of the unit cell, the back electrode plate 206 was shaped so as to form a tab 212 for positive voltage output and an opposed tab 211 for negative voltage output. Forty-eight unit cells were superposed on the supporting substrate 207, further copper wires 208 coated with carbon resin were superposed on the upper portion of the unit cells, and busbars 209' for the light-receiving portions and busbars 209" for the bypass diodes, both busbars having a coated conductive adhesive on the back surface thereof, were superposed thereon in predetermined positions. In the unit cell at the left hand end, an external bypass diode 210 is inserted between the tab 206" of the back electrode plate of this unit cell and the negative voltage output terminal tab 211 of the module. In FIG. 3G', for the purpose of clarity, the mutually overlapping members are shown in a somewhat displaced relationship.

In this state, all components were thermally pressed in a vacuum laminator, whereby the copper wires 208 and the bus bars 209' and 209" were adhered to the silicon surface. Then the unnecessary portions of the copper wires 208 between the unit cells were cut off by applying a blade at broken lines R-S and T-U in FIG. 3G'. The series connection was completed in this manner.

Figure 3H:
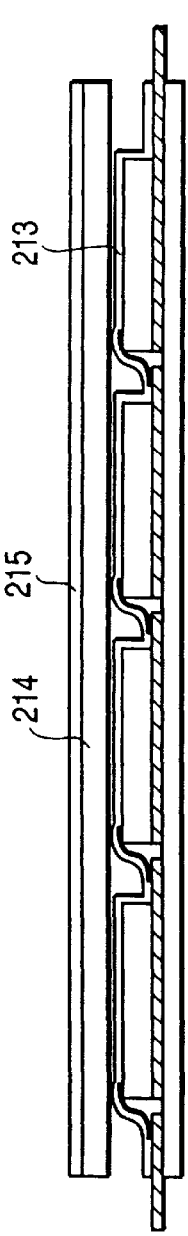

Then, as shown in FIG. 3H, the surfaces of the unit cells was sprayed with a solution obtained by dissolving fine powder of titanium oxide in a solvent, and the surfaces were cured at about 150° C., thereby forming a titanium dioxide film 213 with a thickness of about 0.07 µm. The titanium dioxide film 213 was formed also between the light-receiving portion and the bypass diode portion and between the unit cells, but it does not generate a leakage current because of the high resistance and functions as a semiconductor surface protecting layer to reduce a reverse current in the light-receiving portion in the dark state.

Figure 3I:
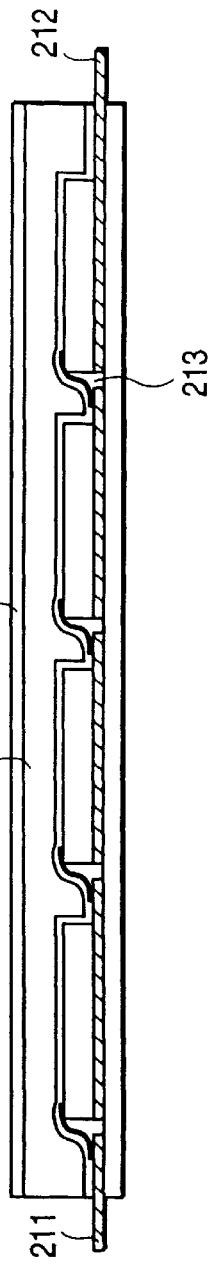

Then a PVA resin sheet 214 as a filler layer and a ETFE resin sheet 215 as a surface protecting layer were superposed and curing was conducted again at 150° C., whereby the PVA resin 214 was thermally melted and filled in gaps between the protruding portions of the unit cells to fill spaces between the ETFE resin sheet 215 and other components with the ETFE resin sheet 215. When the obtained module was cooled to room temperature, the ETFE resin sheet 215 was strongly adhered to other components (FIG. 3I).

The external bypass diode 210 shown in FIG. 3G' was obtained by laser scribing the surface of the $n^+$-type single-crystalline silicon layer 204 in a checkerboard pattern so as to obtain a chip having the same shape as that of the incorporated bypass diodes 204", after the deposition of the $n^+$-type single-crystalline silicon layer 204 in the above-described steps. In this operation, the groove 205 was formed with a depth of about 5 μm larger than in the case of the incorporated bypass diodes. Then a copper sheet was adhered on the surface and then was peeled whereby the semiconductor layer was peeled from the laser scribed groove 205 to obtain a diode chip of the desired size. The obtained diode chip was cut off by applying a blade to the copper sheet.

Because of the above production steps, the external bypass diode 210 is the same in characteristics as the incorporated bypass diodes 204", and is not only effective for shunt passivation but also is easy to produce because the production step is common. Furthermore, since these bypass diodes have the same thickness, the completed module is free from protruding portions, thereby being compact in appearance and being less susceptible to damage under the application of an external force.

After the peeling of the single-crystalline silicon sheet (202', 203, 204), the wafer 201 has remaining portions of the porous layer 202 on the surface. The remaining portions were etched off under agitation with a mixture solution of hydrofluoric acid, hydrogen peroxide and deionized water. The non-porous portion of the wafer 201 had an extremely low etching rate for the above-mentioned etching solution and a selective ratio of $10^5$ or more in comparison with the etching rate of the porous layer 202, so that the etching amount of the wafer was practically negligible. The wafer 201, the surface of which was smoothed in this step, could be again subjected to anodization, and a plurality of single-crystalline sheets could be obtained from one expensive single-crystalline wafer 201 by repeating the above-described process steps. Consequently the solar cell with a high energy conversion efficiency can be produced at a low cost.

The completed solar cell module had a configuration shown in FIGS. 1A to 1C. Under the measurement with a solar simulator of AM-1.5, the module exhibited an energy conversion efficiency of 15%. Then, with one of the unit cells of the module being masked, the module exhibited an energy conversion efficiency of 14.5%, which is only a small loss in output. Also after the module in this state was installed outdoors and used for one year, the module did not have any damage or degradation in output, thereby proving a high reliability even under an abnormal condition of use.

On the other hand, a comparative module was produced according to the steps explained with reference to FIGS. 2A to 2F' except that the bypass diodes were not formed. This module exhibited an energy conversion efficiency of 15.5% under the normal condition with a slight increase in the efficiency due to the absence of the area loss resulting from the presence of the bypass diodes, but the energy conversion efficiency decreased extremely to about 1% when one of the unit cells was masked. Also after one year of outdoor use, the masked unit cell had short circuited.

Also in the thus obtained module, the semiconductor layer is made thinnest as required from the function thereof, and the series connecting portion and the bypass diode are also made very thin. For these reasons, the thickness of the entire module is as small as 500 μm, so that the module is very light and flexible in spite of the use of the single crystal. Consequently, the solar cell module can be easily mounted on the structure with a curved surface, so that the field of application of the solar cell can be expanded. Furthermore, the series connection step for the crystalline type solar cells, which is often made complicated in a conventional method, can be easily automated since the series connection can be achieved by successively stacking the components on the supporting substrate.

EXAMPLE 2

In this example, the present invention is applied to a solar cell module employing ribbonlike polycrystalline silicon obtained by the edge defined growth (EDG) method. In the EDG method, an extrusion mold defining both edges of the ribbon is immersed in fused silicon, a meniscus of fused Si is formed by surface tension and the fused Si is gradually elevated to obtain a Si ribbon with a predetermined width. This method provides a high utilization efficiency of a raw material since it is unnecessary to slice and polish a crystalline ingot and also since the obtained ribbon has a relatively small thickness of about 100 to about 300 μm. However, the width of the ribbon is conventionally limited to about 25 to about 50 mm. For this reason, it is difficult to obtain a large unit cell, whereby a large amount of work is required for series connection including the connection of the bypass diodes and the total manufacturing cost cannot be lowered much despite the lowered manufacturing cost of a crystal.

The method of this example is applicable also to a usual crystalline wafer, but is particularly effective in the case of producing the module with relatively small crystals such as the ribbonlike crystal, since the series connection can be achieved efficiently. In the following, the method will be explained with reference to FIGS. 6A to 6F.

A ribbonlike single-crystalline silicon with a thickness of 25 mm and a thickness of 100 μm was prepared by the EDG method. The obtained single crystal was cut into a length of 300 mm to prepare ribbonlike crystals 501 (first semiconductor layer) for the unit cells (FIG. 6A). Then, in a CVD apparatus, a phosphorus silicate glass (PSG) layer 502 was deposited with a thickness of 20 nm on the surface of the ribbonlike crystal 501 at 560° C. (FIG. 6B). Then a groove 503 was formed by laser scribing on the surface of the PSG layer 502 to form a light-receiving portion 502' and a bypass diode portion 502". Also a groove was formed in the periphery of the ribbonlike crystal (FIG. 6C). FIG. 6C' is a top plan view of FIG. 6C.

Then the ribbonlike crystal was annealed for 30 minutes at 1050° C. in a nitrogen stream, and phosphor (P) was diffused in the ribbonlike crystal 501 to form an $n^+$-type layer 504 on the surface. The remaining PSG layer was etched off with an aqueous solution of hydrofluoric acid. The n+-type layer was not formed in the region of the groove 503, so that the n+-type layer 504 was separated by the groove 503 into the light-receiving portion 504' (main region) and the bypass diode portion 504" (subregion) (FIG. 6D). This method allows formation of the bypass diode minimally affecting the Si layer and not requiring a complicated photolithographic process.

Then, on the back surface of the substrate, a back electrode plate 505 of stainless steel was adhered with an aluminum paste 506, and the paste was cured at 600° C. (FIG. 6E). The back electrode plate 505 of stainless steel was provided with tabs similarly as in Example 1 (FIG. 6E'). Thereafter, subsequent steps similar to those in Example 1 were executed to obtain a solar cell module using the unit cells connected in series by utilizing 48 ribbonlike crystals (FIG. 6F). As shown in FIG. 6F, the module was formed by placing 48 unit cells on a supporting substrate 507, then placing copper wires 508 coated with a carbon resin on the upper portions of the unit cells, further placing busbars 509' for the light-receiving portion and busbars 509" for the bypass diode, both busbars being coated with a conductive adhesive in predetermined positions, and providing a positive terminal electrode 512 and a negative terminal electrode to which an external bypass diode 510 is connected.

Also this module exhibited a small loss in the energy conversion efficiency in the partial shade state. The degradation of the characteristics was also not observed even in the outdoor partial shade test. The ribbonlike crystal 501 employed in this example had a thickness of 100 $\mu$m, considerably thicker than that in Example 1, but in the direction of series connection, the width of the crystal was as narrow as 2.5 cm and the connecting portion is freely flexible such that the module showed high flexibility in this direction. Thus, a flexible solar cell module could be produced utilizing the feature of the narrow ribbonlike crystals obtained by the EDG method.

EXAMPLE 3

In this example, the present invention is applied to a solar cell module employing tandem type amorphous silicon (a-Si). The steps of this example will be explained with reference to FIGS. 7A to 7F.

At first, on a stainless steel plate 601 with a thickness of 150 $\mu$m, an aluminum layer 602 with a thickness of 0.1 $\mu$m and a zinc oxide layer 603 with a thickness of 1 $\mu$m were deposited by sputtering (FIG. 7A). Both edge portions 601' and 601" of the stainless steel plate were masked to avoid film deposition (FIG. 7A'). FIG. 7A is a cross-sectional view of FIG. 7A', and FIG. 7A' is a top view of FIG. 7A.

The aluminum layer 602 functions to reflect the light transmitted through a semiconductor layer deposited thereon, thereby returning the reflected light into the semiconductor layer and causing effective absorption of the light therein. The zinc oxide layer 603 functions to suppress the reaction between the aluminum layer 602 and the semiconductor layer, and the zinc oxide layer also functions to extend the optical path length in the semiconductor layer and to increase the absorption therein when the roughness of the surface of the zinc oxide layer is optimized.

Then, in a plasma CVD apparatus, silane ($SiH_4$) gas and phosphine ($PH_3$) gas were made to flow on the zinc oxide layer 603 to deposit an n-type a-Si layer 604 with a thickness of 0.03 $\mu$m as shown in FIG. 7B. Then $SiH_4$ alone was employed to deposit an i-type a-Si layer 605 with a thickness of 0.4 $\mu$m, and $SiH_4$ and diborane ($B_2H_6$) were employed to deposit a p-type microcrystalline Si ($\mu$c-Si) layer 606 with a thickness of 0.02 $\mu$m. The pin junction thus prepared (bottom cell 607) alone has the function of a solar cell. But, in the present example, there were deposited again thereon an n-type a-Si layer 608 with a thickness of 0.02 $\mu$m, an i-type a-Si layer 609 with a thickness of 0.08 $\mu$m and a p-type $\mu$c-Si layer 610 with a thickness of 0.01 $\mu$m to form a pin junction (top cell 611) (FIG. 7B).

In the above configuration, an incident light is dividedly absorbed by the bottom cell 607 and the top cell 611, whereby the degradation of the characteristics by the light irradiation (Staebler-Wronski effect) can be reduced. Also in the CVD steps, the edge portions 601' and 601" of the stainless steel plate were masked to avoid film deposition.

On the top cell 611, there was further deposited an ITO layer 612 with a thickness 0.07 $\mu$m constituting a current collecting electrode (FIG. 7C). As the a-Si based solar cell has a high sheet resistance because the p-type $\mu$c-Si layer 610 is as thin as 0.01 $\mu$m, the ITO layer 612 functions not only as an anti-reflection layer but also as a transparent electrode. Then, as shown in FIG. 7D, an ink pattern containing ferric oxide was printed by screen printing. When the printed pattern was cured at 150° C., the ink-printed portion of the ITO layer 612 was etched to separate the ITO layer into a light-receiving portion 612' (main region) and a bypass diode portion 612" (subregion) (FIG. 7D'). FIG. 7D' is a top plan view of FIG. 7D, and FIG. 7D is a cross-sectional view taken along the line 7D—7D of FIG. 7D'. The separation took place only in the ITO layer 612, but it is usually unnecessary to separate the p-type $\mu$c-Si layer 610 because of its high sheet resistance. However, if necessary, it is also possible to separate not only the ITO layer 612 but also the a-Si Si layer by laser scribing similarly to Example 1. When the p-type $\mu$c-Si layer has a low sheet resistance and the leakage current through this layer is not negligible, it is desirable to separate not only the p-type $\mu$c-Si layer 610 of the top cell 611 but also the p-type $\mu$c-Si layer 610 of the bottom cell 607.

Then, as shown in FIG. 7E, the stainless steel plate on which the solar cell was formed was cut in a stripe-shaped portion 613 where the ITO layer 612 was etched to produce 17 unit cells.

Thereafter, subsequent steps were conducted in the same manner as in Example 1 to obtain a solar cell module with 17 unit cells connected in series (FIG. 7F). The module shown in FIG. 7F was formed by placing 17 unit cells on a supporting substrate 614, then placing copper wires 615 coated with a carbon resin on the upper portions of the unit cells, further placing the busbars 616' for the light-receiving portion and the busbars 616" for the bypass diode, both busbars being coated with a conductive adhesive in predetermined positions, and providing a positive terminal electrode 619 and a negative terminal electrode 618 to which an external bypass diode 617 was connected. However, FIG. 7 shows 4 unit cells only for the purpose of simplicity.

Also the thus produced module exhibited a small loss in energy conversion efficiency in the partial shade state. The degradation of the characteristics was also not observed even in the outdoor partial shade test. Also this solar cell module formed on a stainless steel plate and laminated with a resin is light in weight, highly flexible and resistant to impact such as by hailstones.

EXAMPLE 4

This example shows that the solar cell module of the present invention is suitable for installation on a curved surface. The steps described in Example 1 were conducted up to the formation of the n⁺-type single-crystalline silicon layer using a wafer of 20×20 cm. The light-receiving portion and the bypass portion were separated by laser scribing. Then the intensity of the laser beam was increased to form grooves with a depth of 5 μm in a stripe shape with a width of 1 cm, and the semiconductor sheet was snapped off at the grooves simultaneously with the peeling to obtain unit cells of 1×20 cm in size.

Figure 8A:
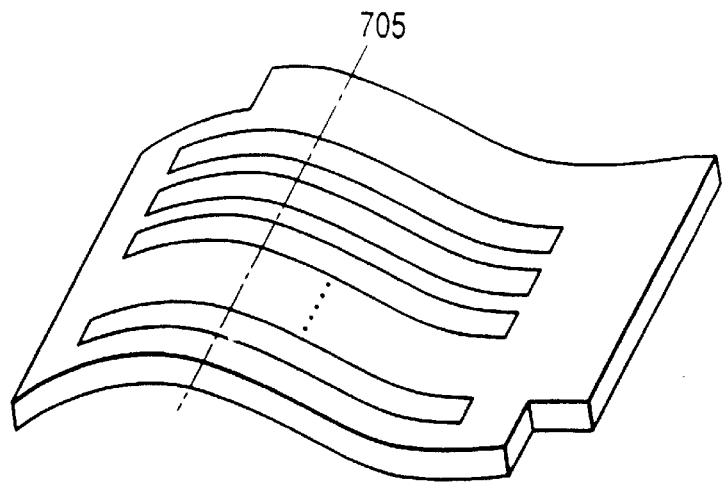
FIGS. 8A and 8B are perspective views showing completed states of solar cell modules according to the examples of the present invention.
Figure 8B:
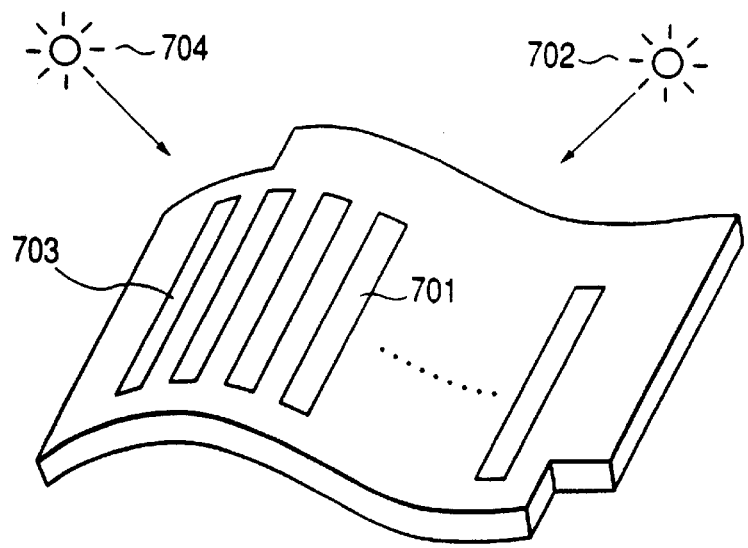
Figure 9:
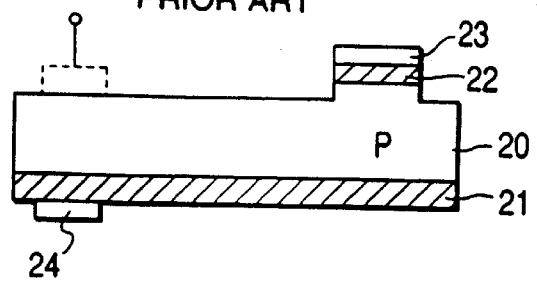
FIG. 9 is a cross-sectional view showing a completed state of a conventional solar cell module.
Figure 10:
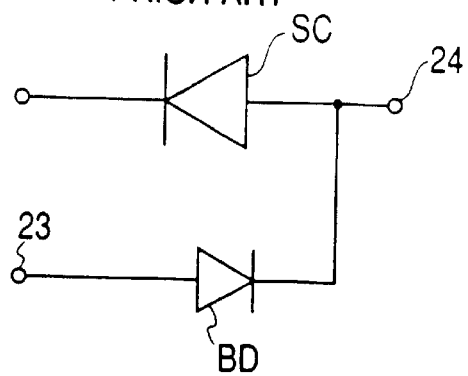
FIG. 10 is an equivalent circuit diagram of a conventional solar cell module.
Figure 11A:
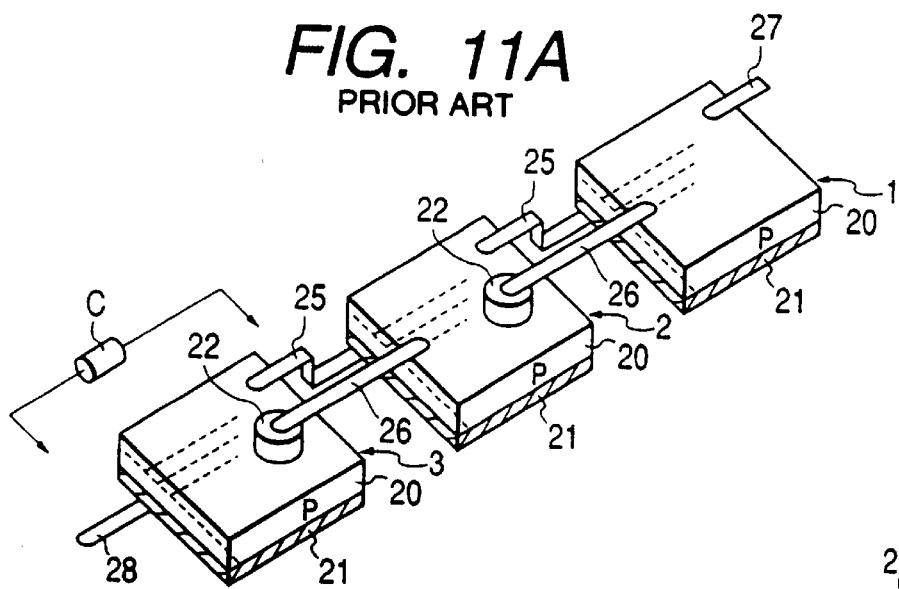
FIGS. 11A and 11B are a perspective view and an equivalent circuit diagram of a conventional solar cell module.
Figure 11B:
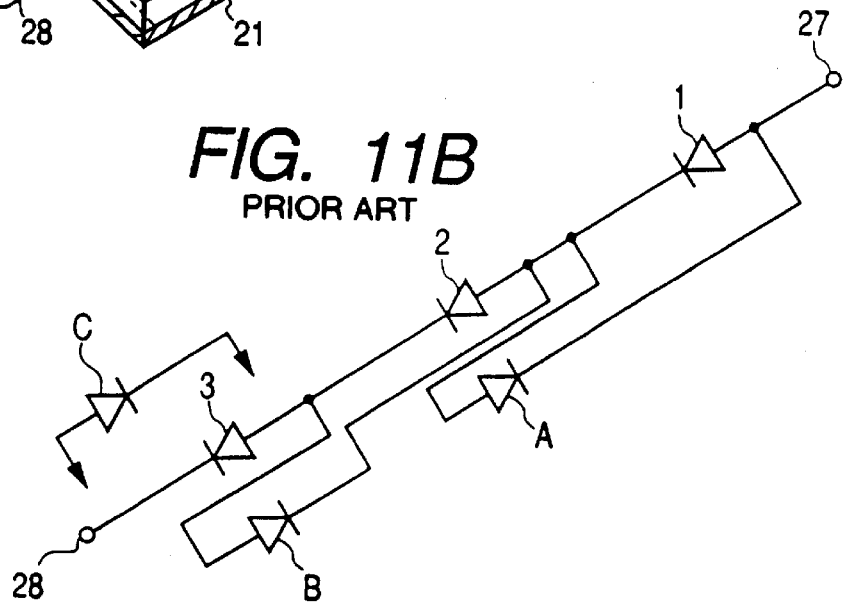
Figure 12A:
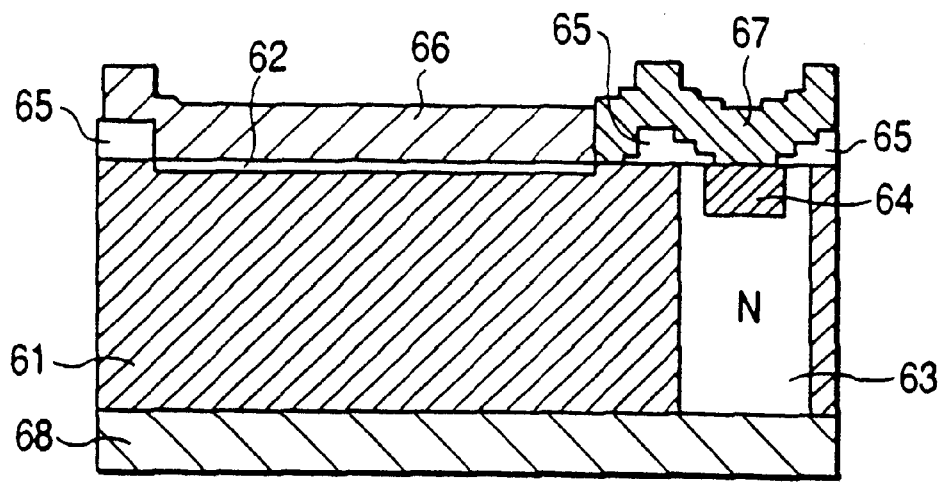
FIGS. 12A and 12B are a top plan view and a cross-sectional view of a conventional solar cell module.
Figure 12B:
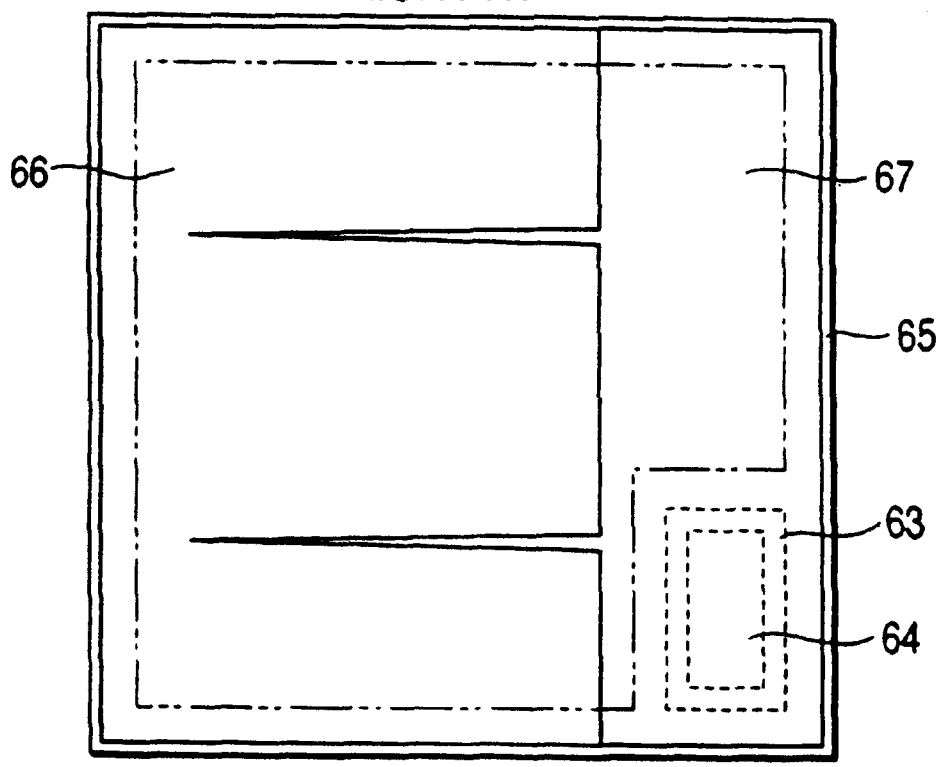
Figure 13A:
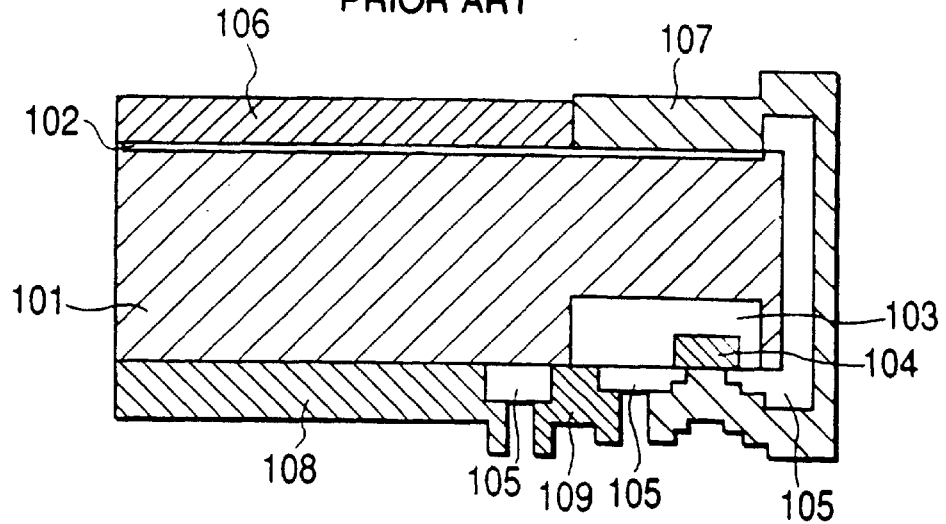
FIGS. 13A and 13B are a top plan view and a cross-sectional view of a conventional solar cell module.
Figure 13B:
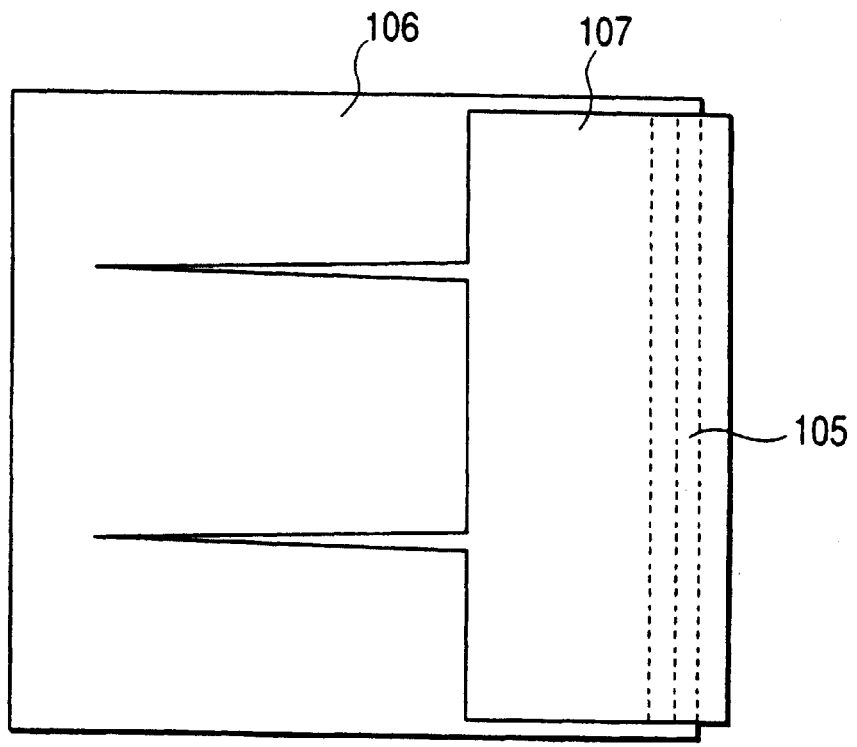

Then a solar cell module employing 24 unit cells connected in series with the incorporated bypass diodes was produced by the steps of Example 1, employing a roof tile as shown in FIGS. 8A and 8B as the supporting substrate. Also in this example, the surface was laminated with ETFE resin similarly to Example 1, but the surface was embossed because a highly glossy surface is undesirable in the appearance of the roof tile. The modules of two types were produced by changing the direction of arrangement of the unit cells on the curved surface of the roof tile.

FIG. 8A shows a solar cell module in which the longitudinal direction of the unit cells is perpendicular to the generating line of the curved surface of the roof tile and the unit cells are connected in series along the direction of the generating line of the curved surface, while FIG. 8B shows a solar cell module in which longitudinal direction of the unit cells is parallel to the generating line of the curved surface of the roof the and the unit cells are connected in series perpendicularly to the direction of the generating line of the curved surface.

In the measurement utilizing a solar simulator, the module shown in FIG. 8A and that in FIG. 8B exhibited substantially the same energy conversion efficiencies, and both modules exhibited a small loss of the efficiency in partial shade state. However, when both modules were evaluated by actually mounting them on a south-side roof of a building, both modules showed almost the same output around noon, but the module shown in FIG. 8A exhibited a relatively stable output from the morning to the evening while the module shown in FIG. 8B exhibited, only in the morning and the evening, an output not larger than a half of the output of the module shown in FIG. 8A.

This is because, in the module shown in FIG. 8B, the morning sunlight 702 falls almost perpendicularly on the unit cell 701 but falls with a considerably shallow angle on the unit cell 703, whereby the output is significantly lowered because the output current of the series connection module is limited by the unit cell of the smallest output current, while the evening sunlight 704 similarly causes the decrease of the output in the unit cell 701.

On the other hand, in the module shown in FIG. 8A, the unit cells are in similar conditions with the morning sunlight 702 and with the evening sunlight 704, so that any one unit cell does not cause an extreme decrease of the output of the module. Is therefore desirable in the series connection module to arrange the longitudinal direction of the unit cells perpendicularly to the generating line 705 of the curved surface and to conduct the series connection of the unit cells along the direction of the generating line 705.

Such a mechanism is considered generally applicable not only to the roof tiles but also to the solar cells of the curved surface to be installed outdoors. Furthermore, the solar cell of the present invention can be easily adaptable to the curved surface because it can be easily made flexible, and the series connection can be achieved by successively stacking the components on the supporting substrate.

As explained in the foregoing, the configuration of the solar cell module of the present invention and the method therefor allow for the incorporation of the bypass diodes by a simple semiconductor step and an automated mounting step, so that a solar cell module with high reliability under various sunshine conditions can be produced at a low cost.

Also, since the produced diode has the same thickness as that of other portions, it does not protrude in the module, so that there can be obtained a flexible solar cell module resistant to external.

What is claimed is:

1. A solar cell module comprising a plurality of unit cells connected in series, each of the unit cells comprising in this order an electrode, a semiconductor layer and a transparent electrode layer, wherein the electrode has a region not covered with the semiconductor layer, wherein the transparent electrode layer has a main region and a subregion which are separated by a groove, wherein the main region of the transparent electrode layer in one unit cell of the unit cells is electrically connected to the region of the electrode not covered with the semiconductor layer in another unit cell adjacent to the one unit cell, and wherein the region of the electrode not covered with the semiconductor layer in the one unit cell is electrically connected to the subregion of the transparent electrode layer in the another unit cell.

2. A solar cell module according to claim 1, wherein each of the unit cells has a rectangular shape, wherein a long side direction of the rectangular shape is arranged so as to be perpendicular to a generating line of a curved surface represented by a cylindrical surface or a conical surface, and wherein each of the unit cells is connected in series in a direction of the generating line.

3. A solar cell module according to claim 1, wherein the semiconductor layer is a semiconductor sheet.

4. A method of producing a solar cell module, which comprises the steps of:

providing a plurality of unit cells, each of the unit cells being produced by forming a second semiconductor layer having a second conductivity type on one surface of a first semiconductor layer having a first conductivity type, forming a groove in the second semiconductor layer to separate the second semiconductor layer into a main region and a subregion, and forming an electrode having a region not covered with the first semiconductor layer on other surface of the first semiconductor layer;

adjacently arranging the plurality of unit cells;

electrically connecting the main region of the second semiconductor layer in one unit cell of the unit cells to the region of the electrode not covered with the first semiconductor layer in another unit cell adjacent to the one unit cell;

electrically connecting the region of the electrode not covered with the first semiconductor layer in the one unit cell to the subregion of the second semiconductor layer in the another unit cell.

5. A method of producing a solar cell module according to claim 4, wherein the formation of the groove is conducted by laser scribing.

6. A method of producing a solar cell module, which comprises the steps of:

providing a plurality of unit cells, each of the unit cells being produced by forming a transparent electrode layer on one surface of a semiconductor layer, forming a groove in the transparent electrode layer to separate the transparent electrode layer into a main region and a subregion, and forming an electrode having a region not covered with the semiconductor layer on other surface of the semiconductor layer;

adjacently arranging the plurality of unit cells;

electrically connecting the main region of the transparent electrode layer in one unit cell of the unit cells to the region of the electrode not covered with the semiconductor layer in another unit cell adjacent to the one unit cell;

electrically connecting the region of the electrode not covered with the semiconductor layer in the one unit cell to the subregion of the transparent electrode layer in the another unit cell.

7. A method of producing a solar cell module according to claim 6, wherein the formation of the groove is conducted by laser scribing.

8. A method of producing a solar cell module, which comprises the steps of:

providing a plurality of unit cells, each of the unit cells being produced by forming a dopant supplying layer on one surface of a first semiconductor layer having a first conductivity type, forming a groove in the dopant supplying layer to separate the dopant supplying layer into a main region and a subregion, forming a second semiconductor layer having a second conductivity type in the one surface of the first semiconductor layer by diffusing a dopant from the dopant supplying layer, and forming an electrode having a region not covered with the first semiconductor layer on other surface of the first semiconductor layer;

adjacently arranging the plurality of unit cells;

electrically connecting the main region of the second semiconductor layer in one unit cell of the unit cells to the region of the electrode not covered with the first semiconductor layer in another unit cell adjacent to the one unit cell;

electrically connecting the region of the electrode not covered with the first semiconductor layer in the one unit cell to the subregion of the second semiconductor layer in the another unit cell.

9. A method of producing a solar cell module according to claim 8, wherein the formation of the groove is conducted by laser scribing.

10. A method of producing a solar cell module, which comprises the steps of:

providing a plurality of unit cells, each of the unit cells being produced by forming a first semiconductor layer having a first conductivity type on an electrode, forming a second semiconductor layer having a second conductivity type on the first semiconductor layer, and forming a groove in the second semiconductor layer to separate the second semiconductor layer into a main region and a subregion, a portion of a surface of the electrode being exposed;

adjacently arranging the plurality of unit cells;

electrically connecting the main region of the second semiconductor layer in one unit cell of the unit cells to the region of the electrode not covered with the first semiconductor layer in another unit cell adjacent to the one unit cell;

electrically connecting the region of the electrode not covered with the first semiconductor layer in the one unit cell to the subregion of the second semiconductor layer in the another unit cell.

11. A method of producing a solar cell module according to claim 10, wherein the first semiconductor layer is formed so that the portion of the surface of the electrode is exposed.

12. A method of producing a solar cell module according to claim 10, wherein after the first semiconductor layer is formed, the portion of the surface of the electrode is exposed.

13. A method of producing a solar cell module according to claim 10, wherein the formation of the groove is conducted by laser scribing.

14. A method of producing a solar cell module, which comprises the steps of:

providing a plurality of unit cells, each of the unit cells being produced by forming a semiconductor layer on an electrode, forming a transparent electrode layer on the semiconductor layer, and forming a groove in the transparent electrode layer to separate the transparent electrode layer into a main region and a subregion, a portion of a surface of the electrode being exposed;

adjacently arranging the plurality of unit cells;

electrically connecting the main region of the transparent electrode layer in one unit cell of the unit cells to the region of the electrode not covered with the semiconductor layer in another unit cell adjacent to the one unit cell;

electrically connecting the region of the electrode not covered with the semiconductor layer in the one unit cell to the subregion of the transparent electrode layer in the another unit cell.

15. A method of producing a solar cell module according to claim 14, wherein the first semiconductor layer is formed so that the portion of the surface of the electrode is exposed.

16. A method of producing a solar cell module according to claim 14, wherein after the first semiconductor layer is formed, the portion of the surface of the electrode is exposed.

17. A method of producing a solar cell module according to claim 14, wherein the formation of the groove is conducted by laser scribing.

* * * * *

UNITED STATES PATENT AND TRADEMARK OFFICE
CERTIFICATE OF CORRECTION

PATENT NO. : 6,384,313 B2
DATED : May 7, 2002
INVENTOR(S) : Katsumi Nakagawa et al.

It is certified that error appears in the above-identified patent and that said Letters Patent is hereby corrected as shown below:

Title page,
Item [57], ABSTRACT,
Line 15, "structure" should read -- structure, --;
Line 16, "inven-" should read -- and --; and
Line 17, "tion" should be deleted; and
"solar" should read -- a solar --.

Column 1,
Line 14, "module is partly shaded solar cell" should read -- solar cell module is partly shaded --;
Line 15, "module" should be deleted;
Line 26, "direct current" should read -- direct current, --; and
Line 67, "side" should read -- side, --.

Column 2,
Line 6, "addition" should read -- addition, --;
Line 24, "the wiring" should read -- of the wiring --;
Line 29, "substrate" should read -- substrate, --;
Line 59, "series" should read -- series connection --; and
"to" should read -- to a --;
Line 60, "module. The case" should read -- module --; and
"such" should read -- such a --; and
Line 65, "term" should read -- in terms --.

Column 15,
Line 26, "roof the" should read -- roof --; and
Line 53, "Is therefore" should read -- It is, therefore, --.

Column 16,
Line 8, "external." should read -- external force. --; and
Line 47, "on other surface" should read -- on another surface --.

UNITED STATES PATENT AND TRADEMARK OFFICE
CERTIFICATE OF CORRECTION

PATENT NO. : 6,384,313 B2
DATED : May 7, 2002
INVENTOR(S) : Katsumi Nakagawa et al.

It is certified that error appears in the above-identified patent and that said Letters Patent is hereby corrected as shown below:

Column 17,
Line 4, "on other" should read -- on another --.

Signed and Sealed this

Twenty-eighth Day of October, 2003

JAMES E. ROGAN
*Director of the United States Patent and Trademark Office*